(12) United States Patent
Ung et al.

(10) Patent No.: US 7,299,388 B2
(45) Date of Patent: Nov. 20, 2007

(54) METHOD AND APPARATUS FOR SELECTIVELY ACCESSING AND CONFIGURING INDIVIDUAL CHIPS OF A SEMI-CONDUCTOR WAFER

(75) Inventors: Rath Ung, Apex, NC (US); Jan Zieleman, Cary, NC (US); Robert Perry, Cary, NC (US); Norbert Rehm, Apex, NC (US); Dirk Fuhrmann, Alex, NC (US)

(73) Assignee: Infineon Technologies, AG, Neubiberg (DE)

( * ) Notice: Subject to any disclaimer, the term of this patent is extended or adjusted under 35 U.S.C. 154(b) by 175 days.

(21) Appl. No.: 11/175,280

(22) Filed: Jul. 7, 2005

(65) Prior Publication Data
US 2007/0011518 A1  Jan. 11, 2007

(51) Int. Cl.
*G11C 29/00* (2006.01)
(52) U.S. Cl. ............... 714/718; 714/719; 714/714; 714/734; 714/743; 714/25; 714/30; 365/201
(58) Field of Classification Search ............... None
See application file for complete search history.

(56) References Cited

U.S. PATENT DOCUMENTS

| | | | |
|---|---|---|---|
| 6,161,205 A * | 12/2000 | Tuttle | 714/724 |
| 6,357,025 B1 * | 3/2002 | Tuttle | 714/724 |
| 6,622,102 B2 * | 9/2003 | Skidmore | 702/84 |
| 6,830,941 B1 | 12/2004 | Lee et al. | |
| 6,845,478 B2 | 1/2005 | Luong | |
| 6,853,317 B2 | 2/2005 | Kim et al. | |
| 6,883,151 B2 * | 4/2005 | Tsao et al. | 716/4 |
| 7,131,033 B1 * | 10/2006 | Roper et al. | 714/30 |
| 2004/0006404 A1 | 1/2004 | McAdams et al. | |
| 2005/0028058 A1 | 2/2005 | Pemer | |
| 2005/0082664 A1 * | 4/2005 | Funaba et al. | 257/724 |
| 2005/0099201 A1 * | 5/2005 | Ferreira et al. | 324/765 |

* cited by examiner

*Primary Examiner*—Guy Lamarre
*Assistant Examiner*—John P Trimmings
(74) *Attorney, Agent, or Firm*—Edell, Shapiro & Finnan, LLC

(57) ABSTRACT

A method and apparatus according to the present invention enable wafer chips to be configured with a single power on and off sequence and further enable a chip parameter to be adjusted during a wafer test without utilizing that sequence. In particular, each wafer chip under test is assigned a unique programmable identification. Once each chip has been assigned a corresponding identification, the chips may each be individually accessible by that identification to provide parameter values to chip registers to configure that chip. The configured chips may be subsequently tested in parallel to evaluate the parameter settings. In addition, the present invention enables chips to share data I/O pins or lines, thereby reducing the quantity of testing machine pins utilized for each chip and enabling a greater quantity of chips to be tested in a parallel fashion.

14 Claims, 4 Drawing Sheets

METHOD AND APPARATUS FOR SELECTIVELY ACCESSING AND CONFIGURING INDIVIDUAL CHIPS OF A SEMI-CONDUCTOR WAFER

BACKGROUND OF THE INVENTION

1. Technical Field

The present invention pertains to testing of semi-conductor wafers. In particular, the present invention pertains to selective access and configuration of individual chips of a semi-conductor wafer for wafer level testing.

2. Discussion of Related Art

Generally, semi-conductor wafers include a plurality of chips or circuits (e.g., a Dynamic Random Access Memory (DRAM) wafer may include five-hundred chips) that are tested prior to packaging and implementation. Each chip may temporarily adjust internal voltages and other settings by altering values in corresponding chip registers. Once the register settings are optimized, the values may be permanently stored in the registers by disabling corresponding metal fuses that enable adjustment of the register values.

During wafer level testing (e.g., prior to permanent storage of the register settings), the internal voltages or other settings of the chips may be adjusted and parametric or functional tests may be performed. Each chip typically receives the same register settings since the chips are tested in a parallel fashion. The parameter adjustment allows for testing of the chip with the same conditions encountered after the permanent storage. However, various characteristics (e.g., measured internal voltages, etc.) of the chips may vary due to process variation. For example, one chip may have an internal voltage of 1.0 V while another chip may have an internal voltage of 1.1V.

In order to minimize the variation, each chip should have an individual adjustment or setting. However, since the chips are tested in a parallel fashion as described above, each chip receives the same register settings, thereby preventing individual adjustment of each chip to mitigate the variation.

The related art has provided a technique to enable the individual wafer chips to receive different register settings in an attempt to overcome this problem. Initially, the wafer level test may utilize various test mode commands that are recognized by the chips to initiate and control testing of the chips. These commands are typically issued from a wafer testing machine. For example, a mode register set (MRS) command may be employed to enable a value to be stored in a chip register. Further, an activate command may be utilized to place a chip in an active state (e.g., non-test mode state), where the chip ignores mode register set and other test mode commands (e.g., the chip registers may not be adjusted while the chip is in the active state).

In order to adjust settings of individual chips, each chip is initially powered down. A first chip is selected and power is enabled to that chip. A mode register set command is issued for the first chip with corresponding register settings. Since the remaining chips are powered down or disabled, the selected chip is configured with the desired settings. The first chip is subsequently issued an activate command to enter an active state. This enables the configured chip to ignore subsequent mode register set commands configuring other chips as described above. The remaining chips are configured in substantially the same manner described above, where a selected chip receives the desired settings via a mode register set command. The other chips that are either in an active state (e.g., previously configured) or are disabled due to lack of power (e.g., not yet configured) ignore the mode register set commands for the selected chip, thereby enabling configuration of a single chip at one time. Once each of the chips have received desired settings, parametric measurement or function tests may be performed on the chips in a parallel fashion to evaluate the settings.

The related art suffers from several disadvantages. In particular, the related art technique depends upon the powering on and off of a chip. In other words, the chip is required to power off and power on prior to setting of each parameter for performing a test, thereby increasing the time and complexity of performing wafer tests.

In addition, chips are typically tested in a parallel fashion to reduce testing time and enhance throughput. Although addresses and commands may be shared by all chips in this type of testing mode, test information (e.g., pass/fail, etc.) is unique to each chip, thereby requiring each chip to have a dedicated Input/Output (I/O) line. Since a wafer testing machine has a fixed quantity of available contacts to engage chip I/O lines for testing, the dedicated I/O line for each chip increases usage of available testing machine contacts and limits the quantity of chips that may be tested in parallel.

SUMMARY OF THE INVENTION

According to the present invention, a method and apparatus enable wafer chips to be configured with a single power on and off sequence. The present invention further enables a chip parameter to be adjusted during a wafer test without utilizing a power on and off sequence. In particular, the present invention assigns each wafer chip under test a unique programmable identification. Once each chip has been assigned a corresponding identification, the chips may each be individually accessible by the corresponding identification to provide parameter values to chip registers to configure that chip. The configured chips may be subsequently tested in parallel to evaluate the parameter settings.

In addition, the present invention enables chips to share data I/O pins or lines. These pins or lines are coupled to the pins of the testing machine to transfer information. Specifically, a chip may be individually accessed to control usage of an I/O pin or line shared with one or more other chips. Since the quantity of pins is generally fixed for a testing machine, the amount needed by each chip for a test limits the amount of chips tested in parallel. However, sharing of I/O pins or lines reduces the amount needed by each chip, thereby increasing the quantity of testing machine pins available for testing and enabling a greater quantity of chips to be tested in a parallel fashion.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION OF THE PREFERRED EMBODIMENTS

Figure 1A:
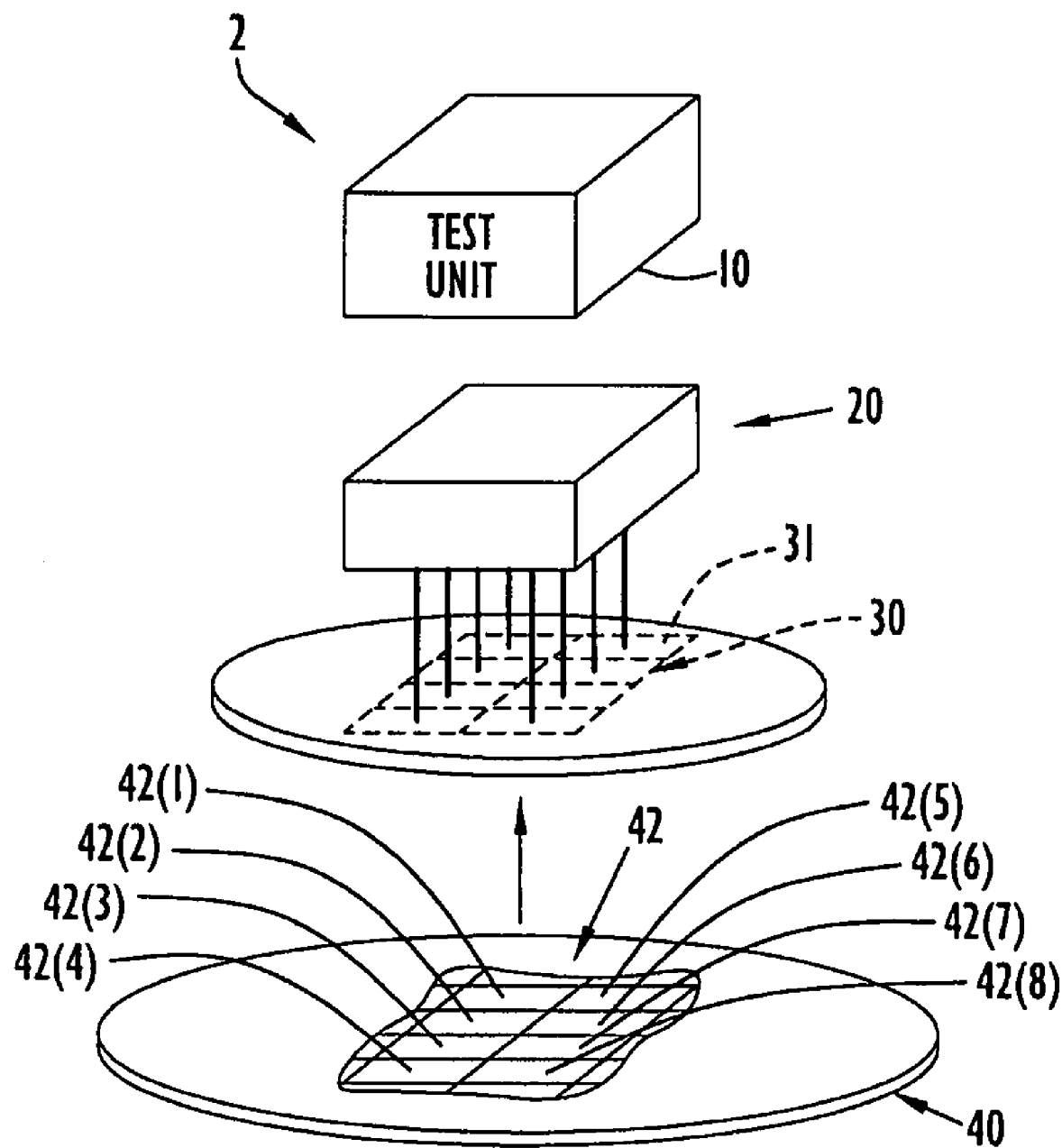
FIG. 1A is a diagrammatic illustration of an exemplary wafer test system individually configuring Dynamic Random Access Memory (DRAM) chips of a wafer according to the present invention.

An exemplary wafer test system employing the present invention is illustrated in FIG. 1A. In particular, wafer test system 2 includes a test unit 10, a connector 20 and a probe card 30. The wafer test system may be implemented by any conventional wafer testing system or components. An example of a wafer test system is disclosed in U.S. Pat. No. 6,845,478 (Luong), the disclosure of which is incorporated herein by reference in its entirety. Test unit 10 is programmable and includes a processor to generate test patterns, issue test mode commands and generally control testing. The test unit is coupled to probe card 30 via connector 20. The probe card includes a series of contact sets 31 for interfacing chips 42 on a wafer 40 under test. By way of example only, chips 42 are Dynamic Random Access Memory (DRAM) type chips and the probe card includes eight contact sets 31 to enable parallel testing of eight corresponding chips 42(1)-42(8). However, the chips may be of any type (e.g., integrated circuits, logic, gates, etc.), while the probe card may include any suitable quantity of contact sets. The probe card enables transfer of signals between the chips and test unit 10.

Figure 1B:
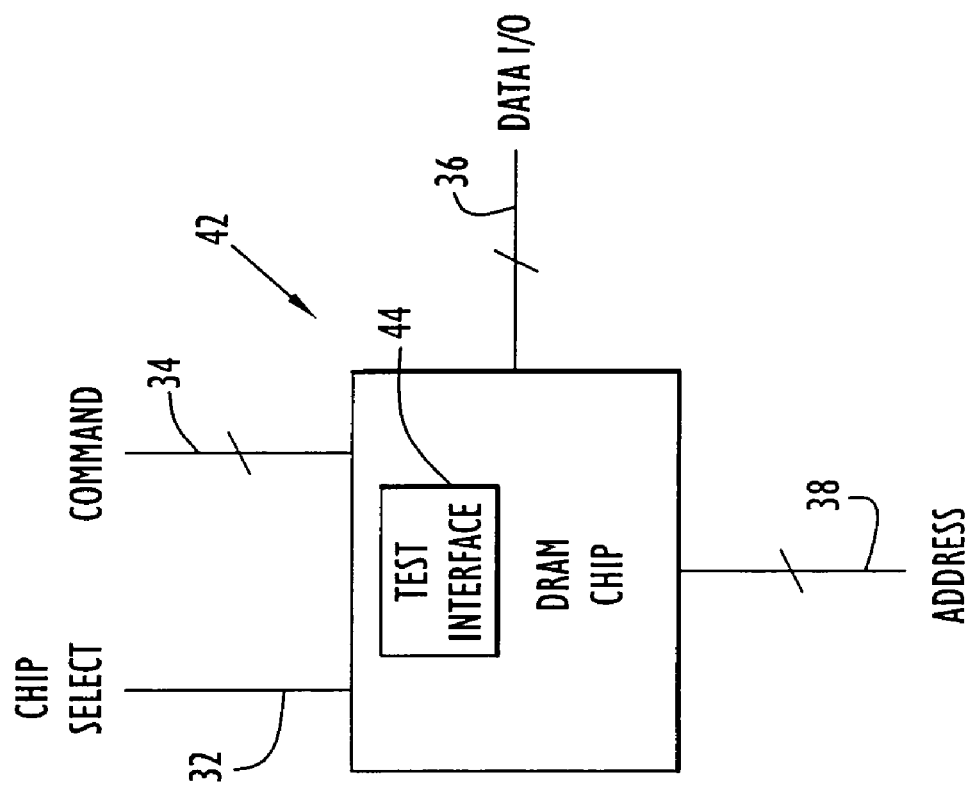
FIG. 1B is a block diagram of an exemplary DRAM chip tested by the system of FIG. 1.

An exemplary DRAM chip 42 is illustrated in FIG. 1B. In particular, chip 42 includes a chip select line 32, a command line 34, a data or I/O line 36, an address line 38 and a test interface 44. The chip select line provides signals enabling chip 42. This line may be used during test and normal operation to enable the chip. Command line 34 provides commands to control operation of chip 42. Commands (e.g., MODE REGISTER SET (MRS), etc.) may be received by the chip from test unit 10 during testing, or external devices may provide commands (e.g., ACTIVATE, PRECHARGE, WRITE, READ, etc.) to the chip for normal operation. Data line 36 serves as an input/output (I/O) line to transfer signals between the chip and test unit during testing or between the chip and external devices for normal operation. Address line 38 provides addresses to the chip during testing and normal operation to enable access of particular memory locations. Test interface 44 enables the chip to enter a test mode and perform various operations in response to test mode commands received from test unit 10. The chip enters a test mode in response to signals received from the test unit during a test initialization.

Typically, plural chips may be contacted by probe card 30 (FIG. 1A) simultaneously to test those chips in a parallel fashion during wafer level test. Each chip receives and processes the same test signals (e.g., command, address, data, etc.) provided by the test unit. Thus, this technique prevents accessibility and configuration of individual chips since each chip is receiving the same signals. Accordingly, the present invention enables the chips to be individually accessible for configuration. In other words, the present invention enables configuration to be performed sequentially (e.g., one chip at a time), while wafer test is performed in a parallel fashion to maintain reduced testing time and enhanced throughput. Test unit 10 and test interface 44 utilize test mode commands (e.g., MODE REGISTER SET, TMIDSET, TMIDSELECT, SET PARAMETER, etc.) as described below to assign each of the chips a unique programmable identification and to set parameter values. This identification is utilized to selectively assign desired parameter values to registers of a particular chip to configure that chip as described below.

The present invention preferably employs a plurality of test mode commands to ensure that a signal is interpreted by selected chips. A test mode set identification command (e.g., TMIDSET) is utilized by test unit 10 to assign an identification to a particular chip. This command is issued when chip 42 is in a test mode. Basically, test unit 10 issues a mode register set (MRS) command that is received by the chip on command line 34 (FIG. 1B). The set identification command is provided to chip 42 via address line 38. When the chip receives the mode register set command, the test interface examines the address line and performs the appropriate functions in response to the presence of the set identification command. If the address line has sufficient capacity, the particular identification may be transmitted with the set identification command and stored in the corresponding chip register. If the address line lacks sufficient capacity for the identification and command, the identification is transmitted in a subsequent transmission to the address line for storage in the corresponding chip register. The particular register storing the identification may be predetermined or may be indicated by either the mode register set or set identification commands.

Once each chip receives a unique identification, a test mode select identification command (e.g., TMIDSELECT) is utilized to select the chip with a specified identification. This command in conjunction with the specified chip identification directs the chip with the specified identification to interpret subsequent signals, while directing remaining chips with different identifications to ignore those signals, thereby individually accessing the specified chip. Basically, test unit 10 issues a mode register set (MRS) command that is received by the chip on command line 34 (FIG. 1B). The select identification command is provided to chip 42 via address line 38. When the chip receives the mode register set command, the test interface examines the address line and performs the appropriate functions in response to the presence of the select identification command. If the address line has sufficient capacity, the particular chip identification may be transmitted with the select identification command. If the address line lacks sufficient capacity for the chip identification and command, the chip identification is transmitted in a subsequent transmission to the address line.

The test unit may issue these commands in accordance with a test sequence supplied by a user, while test interface 44 is configured to interpret these commands and perform the corresponding functions. The test unit and test interface may be implemented by any suitable hardware (e.g., processor, circuitry, logic, etc.) and/or software modules to perform these tasks.

In addition, the test unit and test interface may be configured to utilize further test mode commands. For example, a test mode read identification command (e.g., TMIDREAD) may be utilized to selectively retrieve the identification from each chip to verify chip settings for diagnostic purposes. Further, a test mode reset identification command (e.g., TMIDRESET) may be employed to selectively reset the identification of each chip to a default or initial value (e.g., 0000). These commands may be utilized in conjunction with a mode register set command in substantially the same manner described above.

Figure 2:
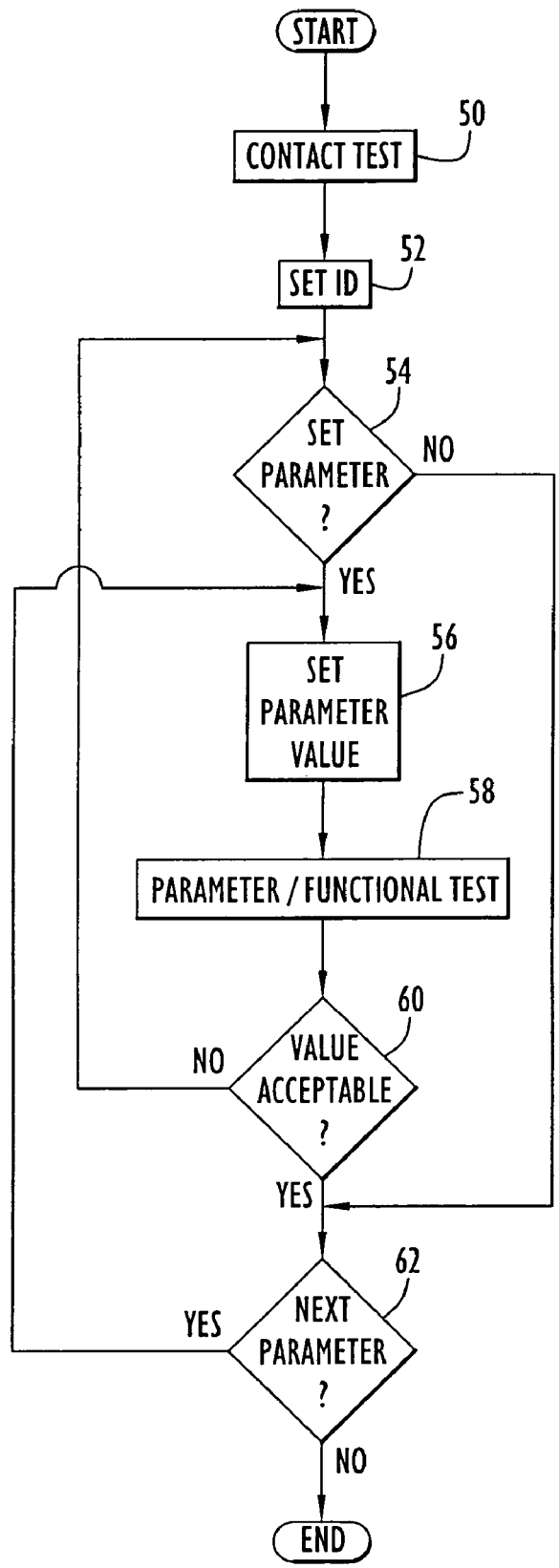
FIG. 2 is a procedural flow chart illustrating the manner in which chips of a wafer are individually accessed and configured according to the present invention.

The manner in which chips 42 of wafer 40 may be individually configured according to the present invention is illustrated in FIG. 2. In particular, chips 42(1)-42(8) on wafer 40 (FIG. 1A) are selected for testing in a parallel fashion. The quantity of selected chips corresponds to the quantity of contact sets of probe card 30. The contact sets each engage a corresponding chip 42(1)-42(8) on wafer 40 and a contact test is initially performed at step 50. This test is initiated by test unit 10 and basically verifies appropriate contact between the wafer test system (e.g., probe card 30) and chips 42(1)-42(8).

Once appropriate contact between the system and chips is verified, the test unit provides signals to enable the chips to enter a test mode and assigns each chip 42(1)-42(8) under test a unique identification at step 52. The assignment of identifications is typically performed sequentially to assign a unique identification to each chip one chip at a time. In particular, power to each chip 42(1)-42(8) is initially disabled (e.g., $V_{DD}$=0V) and subsequently enabled to a first chip (e.g., chip 42(1), where $V_{DD}$=1.8V) by the test unit. The test unit issues a set identification command (e.g., a MODE REGISTER SET command is provided to chip command line 34 and a TMIDSET is provided to chip address line 38 as described above) to assign an identification (e.g., 0001) to the first chip (e.g., chip 42(1)). The first chip receives and interprets the commands via test interface 44 to enable a corresponding register to receive and store the identification. Since remaining selected chips (e.g., 42(2)-42(8)) are disabled due to a lack of power, these chips ignore the set identification command.

The test unit subsequently issues a select identification command (e.g., a MODE REGISTER SET command is provided to chip command line 34 and a TMIDSELECT command is provided to chip address line 38 as described above) to access a second chip (e.g., chip 42(2)) with an initial identification (e.g., of 0000). The command is received and interpreted by test interface 44 of enabled chips (e.g., chips 42(1), 42(2)) and allows subsequent signals (e.g., TMIDSET and other commands) to be interpreted by the specified chip and ignored by remaining ones of the enabled chips under test. Basically, the select identification command prevents chips that have been assigned an identification from interpreting subsequent set identification commands for other chips and overwriting their assigned identification. Identifications are assigned to the second (e.g., chip 42(2)) and subsequent chips (e.g., chips 42(3)-42(8)) in substantially the same manner described above (e.g., via MODE REGISTER SET, TMIDSET and TMIDSELECT commands).

Once the chips have been assigned identifications, each chip 42(1)-42(8) includes a unique identification and the test unit provides signals to test interface 44 of these chips to disable the select identification command (e.g., TMIDSELECT) for normal test operation. When the select identification command is disabled, each chip receives and interprets signals regardless of the identification assigned to that chip. An exemplary assignment of identifications to chips 42(1)-42(8) is illustrated in Tables I and II below, where the labels for the chips in the Tables (e.g., Chip 1-Chip 8) correspond to chips 42(1)-42(8), respectively, and $V_X$ represents an internal voltage parameter.

TABLE I

| Chip 1 | Chip 5 |
|---|---|
| $V_{DD}$ = 1.8 V | $V_{DD}$ = 1.8 V |
| ID = 0001 | ID = 0101 |
| $V_X$ = 0000 | $V_X$ = 0000 |
| Chip 2 | Chip 6 |

TABLE I-continued

| | |
|---|---|
| $V_{DD}$ = 1.8 V | $V_{DD}$ = 1.8 V |
| ID = 0010 | ID = 0110 |
| $V_X$ = 0000 | $V_X$ = 0000 |
| Chip 3 | Chip 7 |
| $V_{DD}$ = 1.8 V | $V_{DD}$ = 1.8 V |
| ID = 0011 | ID = 0111 |
| $V_X$ = 0000 | $V_X$ = 0000 |
| Chip 4 | Chip 8 |
| $V_{DD}$ = 1.8 V | $V_{DD}$ = 1.8 V |
| ID = 0100 | ID = 1000 |
| $V_X$ = 0000 | $V_X$ = 0000 |

TABLE II

| ID REGISTER | REFERENCE |
|---|---|
| 00000 | Unused (Default Settings) |
| 00001 | Chip 1 |
| 00010 | Chip 2 |
| 00011 | Chip 3 |
| 00100 | Chip 4 |
| 00101 | Chip 5 |
| 00110 | Chip 6 |
| 00111 | Chip 7 |
| 01000 | Chip 8 |
| 01001 | Unused |
| 01010 | Unused |
| 01011 | Unused |
| 01100 | Unused |
| 01101 | Unused |
| 01110 | Unused |
| 01111 | Unused |
| 1xxxx | Unused |

Since the chip registers that store corresponding identifications are each programmable, identifications may be assigned to the chips in any desired fashion enabling a unique identification to be assigned to each chip 42(1)-42(8). Alternatively, a plurality of chips may be assigned the same identification in order to provide the same settings to a group of chips with a common identification. The quantity of available identifications may be increased by increasing the size or capacity of the identification register.

The chip registers storing the chip identification are typically volatile and lose the assigned identification upon loss of power or power down. In order to maintain the assigned identification, the chips may utilize any form of storage that is non-volatile. The identification may be stored in metal fuses (e.g., laser fuses), electrical fuses, flash memory, etc. In this fashion, the assigned identification may be accessed and utilized for wafer test as described above and for further testing at later stages of the manufacturing process (e.g., component test, packaging, etc.).

Once identifications have been assigned, the test unit enables each chip 42(1)-42(8) by providing appropriate signals to select lines 32 of those chips. This enables the chips to receive and interpret test mode select identification and other commands as described below. When a parameter for a chip is desired to be set as determined at step 54, a parameter value is set for the chip at step 56. In particular, a select identification command is issued by the test unit (e.g., a MODE REGISTER SET command is provided to chip command line 34 and a TMIDSET command is provided to chip address line 38 as described above) with a corresponding identification for a desired chip (e.g., an identification of 0001 for chip 42(1) indicated in Tables I and II above). The identification may be transmitted to the chip address line with the select identification command or in a subsequent transmission as described above. A set parameter command is subsequently issued by the test unit to set a parameter (e.g., voltage) to a desired value within a corresponding chip register. Since the desired chip is specified by the select identification command, remaining ones of the chips under test (e.g., chips 42(2)-42(8)) ignore the set parameter command. Thus, only the register within the desired chip (e.g., chip 42(1)) is set to the desired parameter value. The parameter for remaining ones of the chips under test (e.g., chips 42(2)-42(8)) may be set in substantially the same manner described above (e.g., via TMIDSELECT and set parameter commands).

Alternatively, the select identification command may be directed toward plural identifications, or a plurality of chips may include the same identification to assign the same parameter values to a group of chips. An exemplary assignment of parameter values for internal voltages (e.g., $V_X$) of chips 42(1)-42(8) is illustrated in Table III below, where the labels for the chips (e.g., Chip 1-Chip 8) in the Table correspond to chips 42(1)-42(8), respectively.

TABLE III

| Chip 1 | Chip 5 |
|---|---|
| $V_{DD}$ = 1.8 V | $V_{DD}$ = 1.8 V |
| ID = 0001 | ID = 0101 |
| $V_X$ = 0001 | $V_X$ = 0000 |
| Chip 2 | Chip 6 |
| $V_{DD}$ = 1.8 V | $V_{DD}$ = 1.8 V |
| ID = 0010 | ID = 0110 |
| $V_X$ = 0000 | $V_X$ = 0000 |
| Chip 3 | Chip 7 |
| $V_{DD}$ = 1.8 V | $V_{DD}$ = 1.8 V |
| ID = 0011 | ID = 0111 |
| $V_X$ = 0010 | $V_X$ = 0000 |
| Chip 4 | Chip 8 |
| $V_{DD}$ = 1.8 V | $V_{DD}$ = 1.8 V |
| ID = 0100 | ID = 1000 |
| $V_X$ = 0000 | $V_X$ = 0000 |

Once the desired parameter values have been set, the test unit performs a parametric or functional test at step 58. This test is performed in a normal operating mode, where chips 42(1)-42(8) are tested in parallel with each chip receiving and interpreting the same signals from the test unit. Thus, the present invention provides a hybrid approach with assignment of identifications for the chips under test being performed sequentially while testing of those chips is performed in parallel. If the test results are unacceptable as determined at step 60, the above process may be repeated to set the parameter to different values (e.g., at steps 54, 56 and 58). Otherwise, the next parameter may be set as described below.

When the test results are acceptable as determined at step 60, or no new values are desired for a parameter as determined at step 54, subsequent parameters may be set and tested. If a new parameter is desired to be set as determined at step 62, the process returns to step 56 to set the new parameter in substantially the same manner described above (e.g., via TMIDSELECT and set parameter commands). The present invention technique may be utilized to set and test any desired chip parameters. For example, an on die termination (ODT) parameter may be set on each chip in a corresponding register to adjust termination resistance of chip input receivers and improve signal quality. Further, an off chip driver (OCD) parameter may be set for each chip in a corresponding register to adjust chip output drivers for improved speed and performance. Once the desired parameters have been set as determined at step 62, the process terminates. The present invention technique may be applied to subsequent groups of chips on the wafer.

The present invention further enables wafer chips to share I/O pins or lines in a parallel testing environment. In particular, wafer chips are tested in a parallel fashion as described above to reduce testing time and enhance throughput. This mode of testing requires each chip to utilize a dedicated corresponding I/O line to provide test results pertaining to that chip since test results are unique to each chip. However, the tester is typically the limiting factor and includes a fixed quantity of pins, channels and memory available for use. Since sharing of the I/O pins reduces the quantity of tester channels utilized by the chips, a greater quantity of chips may be tested in parallel.

Figure 3:
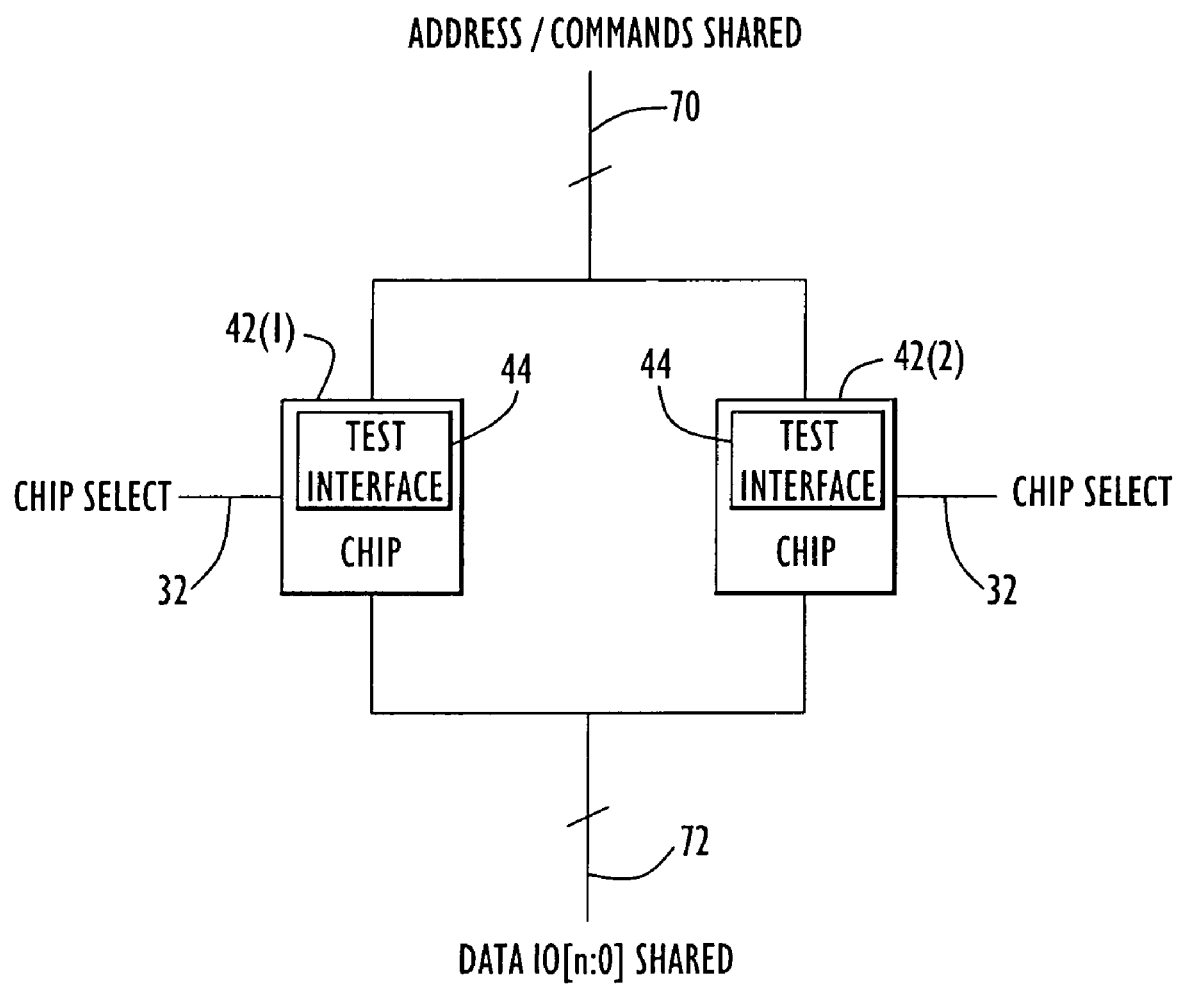
FIG. 3 is a schematic block diagram of exemplary DRAM chips of a wafer sharing an I/O line according to the present invention.

Accordingly, the present invention may utilize the set identification and select identification commands to enable chips to share I/O lines. The sharing of I/O lines optimizes the time and parallelism (e.g., the quantity of chips tested at one time) of the wafer test. By way of example and referring to FIG. 3, chips 42(1) and 42(2) may each be coupled to a common address and command line 70 and to a common data or input/output (I/O) line 72 to transfer signals between the chips and the test unit or external devices. The address and command line provides the same commands and addresses to the chips for parallel operation. The chips are each similar to the chips described above and include test interface 44 to interpret test mode and other commands and chip select lines 32 providing signals to enable the respective chips as described above. Commands and/or addresses are received from the test unit via line 70 and processed by each chip. The chips may further receive common information from the test unit via shared line 72. Thus, each chip 42(1), 42(2) typically executes the same commands on the same data received from the test unit during test. For example, during a function test of a DRAM, writing of data to the chips occurs in parallel, where each chip receives the same commands and writes the same data to specified memory cells.

However, test results from each chip 42(1), 42(2) are provided over shared data line 72 to the test unit. In particular, a unique identification is initially assigned to each chip in substantially the same manner described above. Once the identifications have been assigned, the test unit provides signals to enable the chips via chip select lines 32. This allows the chips to receive and interpret the test mode commands. A function test is performed in parallel, where each chip receives and executes the same commands from the test unit (e.g., writing data in parallel to DRAM chips, etc.). The test results or data is retrieved sequentially from the chips sharing a data line. Specifically, the test unit issues a select identification command (e.g., MODE REGISTER SET and TMIDSELECT commands are provided to chip command and address line 70 in substantially the same manner described above for command line 34 and address line 38) to enable chip 42(1) to provide test result data on the shared I/O line. During this data transmission, chip 42(2) causes a high impedance state on the connection from that chip to the shared I/O line, thereby effectively disconnecting chip 42(2) from the shared I/O line. When the transmission is terminated, chip 42(2) may be selected for data transmission over the shared I/O line via a select identification command (e.g., MODE REGISTER SET and TMIDSE- LECT commands are provided to chip command and address line 70) as described above. In this case, chip 42(1) causes a high impedance state on the connection from that chip to the shared I/O line, thereby effectively disconnecting chip 42(1) from the shared I/O line as described above. If the test unit contains sufficient memory (e.g., fail memory, etc.) to accommodate test result data and there is no other known limitations, then increasing the quantity of chips tested in parallel can be carried out. Other wafer chips may be configured in a similar manner, where any quantity of chips may share any quantity of I/O or other lines.

It will be appreciated that the embodiments described above and illustrated in the drawings represent only a few of the many ways of implementing a method and apparatus for selectively accessing and configuring individual chips of a semi-conductor wafer.

The present invention may be utilized with any desired types of chips (e.g., memory, integrated circuits, gates, etc.), wafer test systems and/or wafers of any desired materials (e.g., various semi-conductor materials (e.g., silicon, etc.), etc.). The wafers may include any quantity of chips arranged in any fashion.

The wafer test system may be implemented by any conventional or other wafer test systems and/or components (e.g., test unit, probe card, connector, etc.). The test unit maybe implemented by any conventional or other test unit and is preferably programmable. The test unit may include any conventional or other microprocessor, controller, circuitry and/or software modules to perform and evaluate any types of desired tests (e.g., transmit any desired commands and test data, receive and analyze test results, etc.). The system may include any quantity of probe cards each enabling engagement with any quantity of chips on a wafer. The probe card may be implemented by any conventional or other interface (e.g., circuitry, connectors, contacts, etc.) to enable transference of signals between the probe card and test unit. The probe card may include any quantity of contact sets each including any quantity of contacts to interface any quantity of chips or chip lines for parallel testing of any quantity of chips. The connector may be implemented by any conventional or other connector to enable transference of signals between the probe card and test unit.

The chips may be of any type and include any quantity of any types of lines or pins (e.g., command, chip select, address, I/O, etc.) arranged in any fashion. The lines or pins may include any desired capacity or accommodate any quantity of signals (e.g., bits, etc.). The chips may include any quantity of registers, each storing any desired quantity of parameters (e.g., internal voltages, etc.) and parameter values. The test interface maybe implemented by any conventional or other hardware (e.g., processor, circuitry, logic, etc.) and/or software modules and may interpret and/or utilize any desired commands to perform corresponding functions (e.g., TMIDSET, TMIDSELECT, SET PARAMETER, etc.).

The various commands (e.g., TMIDSET, TMIDSELECT, SET PARAMETER, etc.) may be provided to the chips over any desired lines (e.g., command, address, etc.) in any desired fashion. The commands may utilize any desired format and may be of any desired length. The chip identification may be of any length, may be of any desired value and may include any desired alphanumeric or other characters. Each chip may include any quantity of identifications. The identification may be stored in any quantity of any desired registers or other storage locations (e.g., chip memory locations etc.). The chip registers may be of any quantity and may be implemented by any conventional or other storage devices (e.g., gates, memory locations, circuitry, etc.). The identification may be unique for each chip, or any quantity of chips may have a common identification to access and/or store parameters for a group of chips with the same identification. The identifications may be determined by the test unit or other device in any fashion (e.g., sequential identifications, random identifications, identifications with any desired offsets, predetermined set of identifications, etc.). The identification or other information within a command may be sent with the command or in any quantity of subsequent transmissions (e.g., an identification may be sent with a TMSETID command or in a subsequent transmission). The identifications may be assigned to chips in any desired order or fashion. The identification may be stored in a volatile or non-volatile fashion via any conventional or other techniques (e.g., volatile or non-volatile memory, laser or other fusing techniques, etc.). The assignment of identifications may be performed as a separate function or be integrated within or part of a test flow.

The present invention may set any desired parameters to any desired values (e.g., the internal voltages may be set to any desired voltages, etc.). The parameter values may be determined by the test unit or other device in any fashion (e.g., based on any suitable conditions or criteria, predetermined, etc.) and may be stored in any quantity of any desired chip registers or other storage locations (e.g., chip memory locations, etc.). The parameter values or other information within a command may be sent with the command or in any quantity of subsequent transmissions (e.g., a parameter value may be sent with a set parameter command or in a subsequent transmission). The chips may be assigned parameter values in any desired order or fashion. Further, the parameters may be assigned in any desired order or fashion. The techniques for setting identifications and parameter values described above and illustrated in the drawings may be modified in any fashion that accomplishes the functions described herein.

The test unit may perform any quantity of any suitable tests once parameter values have been assigned (e.g., memory write, etc.). The test unit may receive and evaluate test results from the chips based on any desired criteria or thresholds. In this case, initiation of adjustment of parameters may be performed automatically in response to unacceptable results. Alternatively, a user may evaluate the test results to determine the need to adjust parameter values. The chips may be configured to share any quantity of any desired lines (e.g., data, address, command, chip select, etc.). Access to the shared lines may be controlled via any suitable commands (e.g., TMIDSET, TMIDSELECT, etc.) from the test unit or other device. A line may be shared by any quantity of chips. A chip may provide any desired characteristic (e.g., impedance, resistance, etc.) or utilize any desired device (e.g., switch, transistor, etc.) to control effective connection to a shared line or pin.

The present invention is not limited to the applications described herein, but may be applied to any parallel testing environment to individually access and adjust any desired parameters or configurations of a unit.

From the foregoing description, it will be appreciated that the invention makes available a novel method and apparatus for selectively accessing and configuring individual chips of a semi-conductor wafer, wherein each wafer chip under test is assigned a unique programmable identification to enable each chip to be individually accessible for storage of parameter values in chip registers in order to configure that chip.

Having described preferred embodiments of a new and improved method and apparatus for selectively accessing and configuring individual chips of a semi-conductor wafer, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A method of testing and individually configuring a plurality of chips of a wafer comprising:
   (a) identifying said plurality of chips of said wafer for testing;
   (b) coupling said identified chips to a wafer test system, wherein said system issues commands to test and configure said plurality of identified chips;
   (c) assigning an identification to each of said identified chips and storing said assigned identification within a corresponding register of that chip in response to said identified chips receiving identification commands from said wafer test system;
   (d) selecting an identified chip; and
   (e) determining at least one parameter value for said selected chip and individually accessing said selected chip based on said assigned identification and storing each determined parameter value in the corresponding chip register to configure that chip in response to said identified chips receiving selection and parameter commands from said wafer test system, wherein at least two of said chips include different parameter values.

2. The method of claim 1, wherein step (c) further includes:
   (c.1) disabling power to said identified chips;
   (c.2) enabling power to one of said identified chips;
   (c.3) assigning an identification to said enabled chip and storing said assigned identification within said corresponding chip register; and
   (c.4) selectively specifying a subsequent chip for assignment of said identification;
   wherein steps (c.2)-(c.4) are repeated until each identified chip has been assigned an identification.

3. The method of claim 1, wherein step (e) further includes:
   (e.1) selecting a parameter of said chip and determining a value for said selected parameter;
   (e.2) individually accessing said selected chip based on said assigned identification and storing said determined value for said selected parameter in a corresponding chip register;
   (e.3) performing a functional test on said chip with said stored parameter value and evaluating test results; and
   (e.4) identifying a subsequent parameter of said chip for determination in response to said test results being acceptable;
   wherein steps (e.1)-(e.4) are repeated for each of said at least one parameter of said chip.

4. The method of claim 1, wherein said plurality of chips each include a test interface, and step (c) further includes:
   (c.1) receiving and processing said identification commands via said test interface to store said assigned identification within said corresponding chip register.

5. The method of claim 1, wherein said plurality of chips each include a test interface, and step (e) further includes:
   (e.1) receiving and processing said selection and parameter commands via said test interface to store each determined parameter value in said corresponding chip register of said selected identified chip.

6. The method of claim 1, wherein each said chip includes a DRAM chip.

7. A system for testing and individually configuring a plurality of chips of a wafer comprising:
   test means for issuing commands to test and configure said plurality of chips including:
      test identification means for identifying and engaging said plurality of chips for testing;
      assignment means for providing identification commands to said plurality of identified chips to assign an identification to each of those chips;
      parameter select means for selecting an identified chip and determining at least one parameter value for said selected chip; and
      parameter storage means for individually accessing said selected chip based on said assigned identification and providing selection and parameter commands to said identified chips to store said at least one parameter value for said selected chip; and
   test interface means disposed on each said chip and including:
      identification means to process said identification commands and store said assigned identification within a corresponding register of that chip; and
      parameter means to process said selection and parameter commands and store each determined parameter value in the corresponding chip register to configure that chip, wherein at least two of said chips include different parameter values.

8. The system of claim 7, wherein said assignment means includes:
   disable means for disabling power to said identified chips;
   selection means for selecting an identified chip for assignment of said identification;
   enable means for enabling power to said selected chip; and
   identification storage means for assigning an identification to said enabled chip and providing said identification command to said enabled chip to store said assigned identification within said corresponding chip register.

9. The system of claim 7, wherein:
   said parameter select means selects a parameter of said selected chip and determines a value for said selected parameter;
   said parameter storage means individually accesses said selected chip based on said assigned identification; and
   said parameter means stores said determined value for said selected parameter in said corresponding chip register and includes:
      functional test means for performing a functional test on said chip with said stored parameter value, wherein said parameter select means identifies a subsequent parameter of that chip for determination in response to said test results being acceptable.

10. The system of claim 7, wherein each said chip includes a DRAM chip.

11. A system for testing and individually configuring a plurality of chips of a wafer comprising:
   a test system to issue commands to test and configure said plurality of chips including:
      a test identification module to identify and engage said plurality of chips for testing;
      an assignment module to provide identification commands to said plurality of identified chips to assign an identification to each of those chips;

a parameter select module to select an identified chip and determine at least one parameter value for said selected chip; and a parameter storage module to individually access said selected chip based on said assigned identification and provide selection and parameter commands to said identified chips to store said at least one parameter value for said selected chip; and a test interface disposed on each chip of said plurality of identified chips and including:

an identification module to process said identification commands and store said assigned identification within a corresponding register of the chip on which the test interface is disposed; and a parameter module to process said selection and parameter commands and store each determined parameter value in a corresponding chip register to configure the chip on which the test interface is disposed, wherein at least two of said plurality of identified chips include different parameter values.

12. The system of claim 11, wherein said assignment module includes:

a disable module to disable power to said identified chips;

a selection module to select an identified chip for assignment of said identification;

an enable module to enable power to said selected chip; and an identification storage module to assign an identification to said enabled chip and provide said identification command to said enabled chip to store said assigned identification within said corresponding chip register.

13. The system of claim 11, wherein:

said parameter select module selects a parameter of said selected chip and determines a value for said selected parameter;

said parameter storage module individually accesses said selected chip based on said assigned identification; and said parameter module stores said determined value for said selected parameter in the corresponding chip register and includes:

a functional test module to perform a functional test on said chip with said stored parameter value, wherein said parameter select module identifies a subsequent parameter of that chip for determination in response to said test results being acceptable.

14. The system of claim 11, wherein each said chip includes a DRAM chip.

* * * * *